US008595605B2

(12) United States Patent
Wilborn et al.

(10) Patent No.: US 8,595,605 B2
(45) Date of Patent: Nov. 26, 2013

(54) SYSTEMS AND METHODS FOR MEMORY MANAGEMENT

(75) Inventors: Thomas B. Wilborn, San Diego, CA (US); Brian C. Banister, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 404 days.

(21) Appl. No.: 12/860,172

(22) Filed: Aug. 20, 2010

(65) Prior Publication Data

US 2012/0047408 A1 Feb. 23, 2012

(51) Int. Cl.
*H03M 13/03* (2006.01)

(52) U.S. Cl.
USPC .......... 714/794

(58) Field of Classification Search
USPC .......... 714/748
See application file for complete search history.

(56) References Cited

U.S. PATENT DOCUMENTS 6,445,688 B1 * 9/2002 Garces et al. .......... 370/334
2002/0136268 A1 * 9/2002 Gan et al. .......... 375/133
2003/0217319 A1 11/2003 Tripathi et al.
2009/0059801 A1 3/2009 Garrett et al.
2009/0135965 A1 * 5/2009 Shen et al. .......... 375/341
2009/0199061 A1 8/2009 Lee
2009/0228755 A1 9/2009 Franovici
2010/0067598 A1 3/2010 Sampath et al.
2010/0157911 A1 * 6/2010 Hegde et al. .......... 370/329
2010/0157912 A1 * 6/2010 Chin .......... 370/329
2011/0276852 A1 * 11/2011 Mueller-Weinfurtner et al. .......... 714/749

FOREIGN PATENT DOCUMENTS

WO 2010069379 A2 6/2010
WO WO2010069379 A2 6/2010

OTHER PUBLICATIONS

International Search Report and Written Opinion—PCT/US2011/048511—ISA/EPO—Jan. 12, 2012.
Michael Ohm, "SIC receiver in a mobile MIMO-OFDM system with optimization for HARQ operation", Alcatel-Lucent Bell Labs.
Partial International Search Report—PCT/US2011/048511—ISA/EPO—Nov. 9, 2011.

* cited by examiner

*Primary Examiner* — James Kramer
*Assistant Examiner* — Neil Miles
(74) *Attorney, Agent, or Firm* — Charles E. Eggers

(57) ABSTRACT

Systems and methods for intelligently reducing the number of log-likelihood ratios (LLRs) stored in memory of a wireless communication device are described herein. In one aspect, the systems and methods described herein relate to selecting LLRs for storage based on a quality metric. In another aspect, the systems and methods described herein relate to improving communication quality in response to available memory capacity.

28 Claims, 10 Drawing Sheets

SYSTEMS AND METHODS FOR MEMORY MANAGEMENT

BACKGROUND

1. Field

The present application relates generally to memory management, and more specifically to systems and methods for intelligently reducing the number of log-likelihood ratios (LLRs) stored in memory of a wireless communication device.

2. Background

Wireless communication systems have become an important means by which many people worldwide have come to communicate. A wireless communication system may provide communication for a number of access terminals, each of which may be serviced by an access point.

An access terminal may communicate with one or more access points via transmissions on the uplink and the downlink. The uplink (or reverse link) refers to the communication link from the access terminal to the access point, and the downlink (or forward link) refers to the communication link from the access point to the access terminal.

The resources of a wireless communication system (e.g., bandwidth and transmit power) must often be shared among multiple access terminals. A variety of multiple access techniques are known, including code division multiple access (CDMA), time division multiple access (TDMA), frequency division multiple access (FDMA), orthogonal frequency division multiple access (OFDMA), single-carrier frequency division multiple access (SC-FDMA), and so forth.

Benefits may be realized by improved methods and apparatus related to the operation of wireless communication systems.

SUMMARY

The systems, methods, and devices of the invention each have several aspects, no single one of which is solely responsible for its desirable attributes. Without limiting the scope of this invention as expressed by the claims which follow, some features will now be discussed briefly. After considering this discussion, and particularly after reading the section entitled "Detailed Description" one will understand how the features of this invention provide advantages that include systems and method for memory management.

One embodiment of the disclosure provides a method of managing storage in a wireless communication device. The method comprises receiving a first data transmission comprising a first plurality of blocks at the wireless communication device. The method further comprises decoding the first plurality of blocks. The method further comprises performing a cyclic redundancy check on each of the first plurality of blocks. The method further comprises determining whether each of the first plurality of blocks passes the cyclic redundancy check. The method further comprises determining whether a memory has sufficient capacity to store a plurality of log-likelihood ratios associated with a first portion of the first plurality of blocks that fail the cyclic redundancy check. The method further comprises selecting for storage a first portion of the plurality of log-likelihood ratios based on a quality metric of each of the associated blocks, wherein the selected first portion of log-likelihood ratios are associated with blocks having higher quality metrics than the quality metrics of the blocks associated with a second portion of the plurality of log-likelihood ratios not selected.

Another embodiment of the disclosure provides a method of managing storage in a wireless communication device. The method comprises receiving a plurality of data transmissions at the wireless communication device from a communication node. The method further comprises determining whether each of the plurality of data transmissions passes a cyclic redundancy check. The method further comprises determining whether storing data associated with one or more of the data transmissions that failed the cyclic redundancy check in a memory would cause an available capacity of the memory to fall below a threshold level. The method further comprises transmitting a quality indicator to the communication node when the available capacity of the memory falls below the threshold level.

Yet another embodiment of the disclosure provides a wireless communication device comprising a memory. The device further comprises a processor coupled to the memory. The processor is configured to receive a first data transmission comprising a first plurality of blocks. The processor is further configured to decode the first plurality of blocks. The processor is further configured to perform a cyclic redundancy check on each of the first plurality of blocks. The processor is further configured to determine whether each of the first plurality of blocks passes the cyclic redundancy check. The processor is further configured to determine whether the memory has sufficient capacity to store a plurality of log-likelihood ratios associated with a first portion of the first plurality of blocks that fail the cyclic redundancy check. The processor is further configured to select for storage a first portion of the plurality of log-likelihood ratios based on a quality metric of each of the associated blocks, wherein the selected first portion of log-likelihood ratios are associated with blocks having higher quality metrics than the quality metrics of the blocks associated with a second portion of the plurality of log-likelihood ratios not selected.

Another embodiment of the disclosure provides a wireless communication device comprising a memory. The device further comprises a processor coupled to the memory. The processor is configured to receive a plurality of data transmissions from a communication node. The processor is further configured to determine whether each of the plurality of data transmissions passes a cyclic redundancy check. The processor is further configured to determine whether storing data associated with one or more of the data transmissions that failed the cyclic redundancy check in the memory would cause an available capacity of the memory to fall below a threshold level. The processor is further configured to transmit a quality indicator to the communication node when the available capacity of the memory falls below the threshold level.

Yet another embodiment of the disclosure provides a wireless communication device comprising means for receiving a first data transmission comprising a first plurality of blocks. The device further comprises means for decoding the first plurality of blocks. The device further comprises means for performing a cyclic redundancy check on each of the first plurality of blocks. The device further comprises means for determining whether each of the first plurality of blocks passes the cyclic redundancy check. The device further comprises means for determining whether a memory has sufficient capacity to store a plurality of log-likelihood ratios associated with a first portion of the first plurality of blocks that fail the cyclic redundancy check. The device further comprises means for selecting for storage a first portion of the plurality of log-likelihood ratios based on a quality metric of each of the associated blocks, wherein the selected first portion of log-likelihood ratios are associated with blocks having higher quality metrics than the quality metrics of the blocks associated with a second portion of the plurality of log-likelihood ratios not selected.

Another embodiment of the disclosure provides a wireless communication device comprising means for receiving a plurality of data transmissions from a communication node. The device further comprises means for determining whether each of the plurality of data transmissions passes a cyclic redundancy check. The device further comprises means for determining whether storing data associated with one or more of the data transmissions that failed the cyclic redundancy check in a memory would cause an available capacity of the memory to fall below a threshold level. The device further comprises means for transmitting a quality indicator to the communication node when the available capacity of the memory falls below the threshold level.

Yet another embodiment of the disclosure provides a computer program product comprising a non-transitory computer-readable medium. The computer readable medium comprises code for causing a computer to receive a first data transmission comprising a first plurality of blocks at a wireless communication device. The computer readable medium further comprises code for causing a computer to decode the first plurality of blocks. The computer readable medium further comprises code for causing a computer to perform a cyclic redundancy check on each of the first plurality of blocks. The computer readable medium further comprises code for causing a computer to determine whether each of the first plurality of blocks passes the cyclic redundancy check. The computer readable medium further comprises code for causing a computer to determine whether a memory has sufficient capacity to store a plurality of log-likelihood ratios associated with a first portion of the first plurality of blocks that fail the cyclic redundancy check. The computer readable medium further comprises code for causing a computer to select for storage a first portion of the plurality of log-likelihood ratios based on a quality metric of each of the associated blocks, wherein the selected first portion of log-likelihood ratios are associated with blocks having higher quality metrics than the quality metrics of the blocks associated with a second portion of the plurality of log-likelihood ratios not selected.

Another embodiment of the disclosure provides a computer program product comprising a non-transitory computer-readable medium. The computer readable medium comprises code for causing a computer to receive a plurality of data transmissions at a wireless communication device from a communication node. The computer readable medium further comprises code for causing a computer to determine whether each of the plurality of data transmissions passes a cyclic redundancy check. The computer readable medium further comprises code for causing a computer to determine whether storing data associated with one or more of the data transmissions that failed the cyclic redundancy check in a memory would cause an available capacity of the memory to fall below a threshold level. The computer readable medium further comprises code for causing a computer to transmit a quality indicator to the communication node when the available capacity of the memory falls below the threshold level.

Any one of the above embodiments may further provide that the first data transmission includes a hybrid automatic repeat request (HARQ) packets, and wherein the first plurality of blocks includes a plurality of codeblocks.

Any one of the above embodiments may further provide that a function of absolute values is at least one of the following: a sum of the absolute values, a mean of the absolute values, a median of the absolute values, a mode of the absolute values.

Any one of the above embodiments may further provide a method or system for discarding the second portion of the plurality of log-likelihood ratios not selected.

Any one of the above embodiments may further provide a method or system for compressing comprising deleting a first plurality of the second portion of the plurality of log-likelihood ratios not selected and storing a second plurality of the second portion of the plurality of log-likelihood ratios not selected.

Any one of the above embodiments may further provide a method or system for compressing comprising reducing a number of bits used to represent each of the second portion of the plurality of log-likelihood ratios not selected.

Any one of the above embodiments may further provide that the quality metric of each of the blocks of the first portion of the first plurality of blocks that fail the cyclic redundancy check is at least one of a modulation and coding scheme level and a rank associated with the first data transmission.

Any one of the above embodiments may further provide that the plurality of data transmissions comprise hybrid automatic repeat request (HARQ) packets.

Any one of the above embodiments may further provide that a threshold level is 80% of an overall capacity of the memory.

Any one of the above embodiments may further provide that the quality indicator comprises a rank index.

Any one of the above embodiments may further provide that the quality indicator comprises a channel quality index.

DETAILED DESCRIPTION

Figure 1:
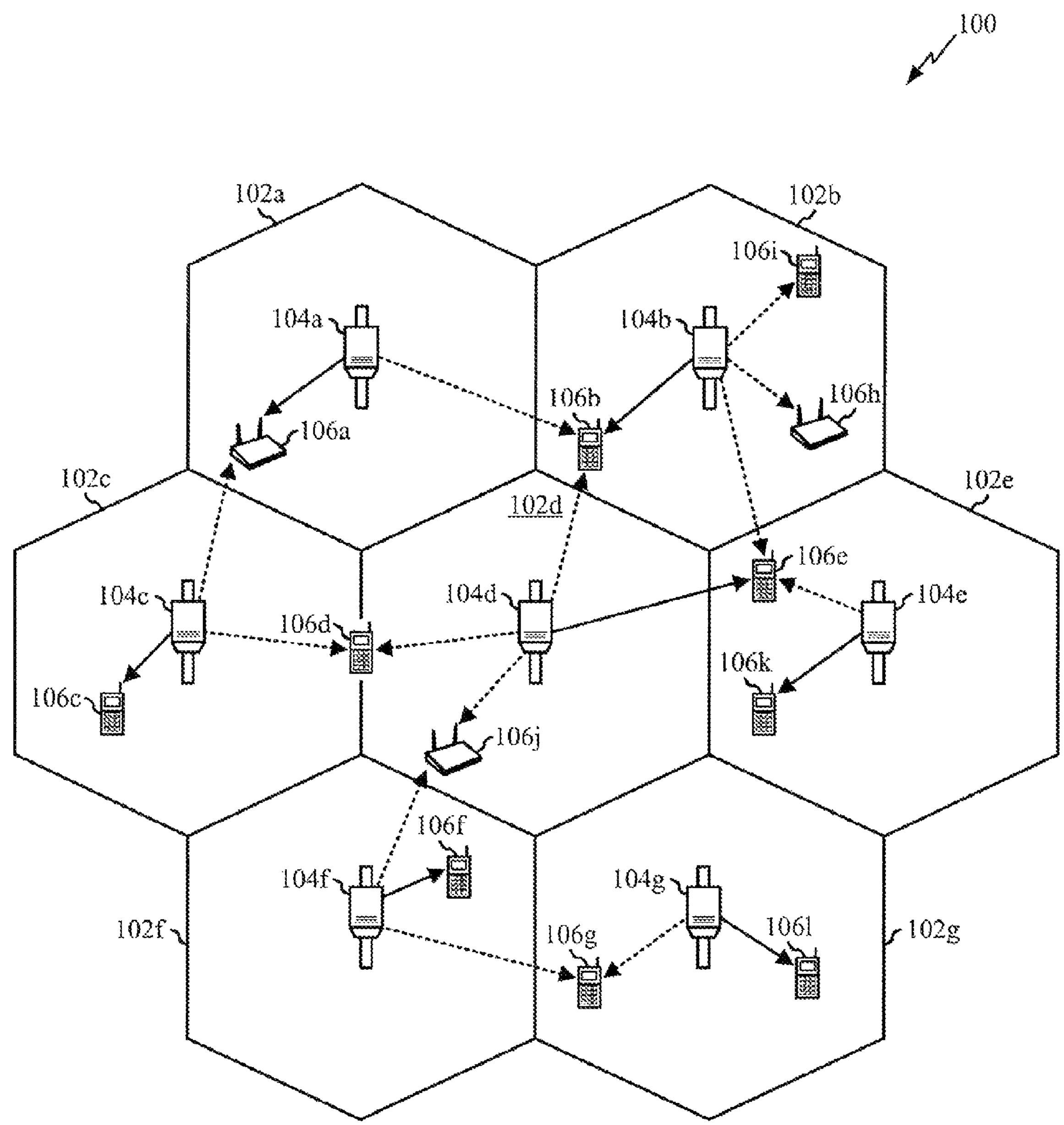
FIG. 1 illustrates an exemplary wireless communication network.

The word "exemplary" is used herein to mean "serving as an example, instance, or illustration." Any embodiment described herein as "exemplary" is not necessarily to be construed as preferred or advantageous over other embodiments. The following description is presented to enable any person skilled in the art to make and use the invention. Details are set forth in the following description for purpose of explanation. It should be appreciated that one of ordinary skill in the art would realize that the invention may be practiced without the use of these specific details. In other instances, well known structures and processes are not elaborated in order not to obscure the description of the invention with unnecessary details. Thus, the present invention is not intended to be limited by the embodiments shown, but is to be accorded with the widest scope consistent with the principles and features disclosed herein.

The techniques described herein may be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms “networks” and “systems” are often used interchangeably. A CDMA network may implement a radio technology such as Universal Terrestrial Radio Access (UTRA), cdma2000, etc. UTRA includes Wideband-CDMA (W-CDMA) and Low Chip Rate (LCR). cdma2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.9, IEEE 802.16, IEEE 802.20, Flash-OFDM", etc. UTRA, E-UTRA, and GSM are part of Universal Mobile Telecommunication System (UMTS). Long Term Evolution (LTE) is an upcoming release of UMTS that uses E-UTRA. UTRA, E-UTRA, GSM, UMTS and LTE are described in documents from an organization named “3rd Generation Partnership Project” (3GPP). cdma2000 is described in documents from an organization named “3rd Generation Partnership Project 2” (3GPP2). These various radio technologies and standards are known in the art.

Single carrier frequency division multiple access (SC-FDMA) utilizes single carrier modulation and frequency domain equalization. SC-FDMA has similar performance and essentially similar overall complexity as an OFDMA system. An SC-FDMA signal has lower peak-to-average power ratio (PAPR) because of its inherent single carrier structure. SC-FDMA has drawn significant attention, especially in uplink communications where lower PAPR greatly benefits the mobile terminal in terms of transmit power efficiency. It is currently a working assumption for an uplink multiple access scheme in 3GPP Long Term Evolution (LTE), or Evolved UTRA (E-UTRA).

For conciseness and clarity in the following description, terminology associated with LTE E-UTRA systems is used. LTE E-UTRA technology is further described in the 3GPP TS 23.401: GPRS Enhancements for E-UTRAN Access (Release 8). It should be emphasized that the invention may also be applied to other technologies and associated standards, such as those related to Wideband Code Division Multiple Access (WCDMA), Time Division Multiple Access (TDMA), Orthogonal Frequency Division Multiple Access (OFDMA), Evolved High Rate Packet Data (eHRPD) and so forth. Terminologies associated with different technologies can vary. For example, depending on the technology considered, the User Equipment (UE) used in LTE can sometimes be referred to as a mobile station, a user terminal, a subscriber unit, an access terminal, etc., to name just a few. Likewise, the Serving Gateway (SGW) used in LTE can sometimes be referred to as a gateway, a HRPD serving gateway, and so forth. Likewise, the evolved Node B (eNB) used in LTE can sometimes be referred to as an access node, an access point, a base station, a Node B, HRPD base station (BTS), and so forth. It will be appreciated that certain terminologies may apply to various different technologies when applicable.

FIG. 1 illustrates an example wireless communication network 100. The wireless communication network 100 is configured to support communication between a number of users. The wireless communication network 100 may be divided into one or more cells 102, such as, for example, cells 102*a*-102*g*. Communication coverage in cells 102*a*-102*g* may be provided by one or more eNBs 104, such as, for example, eNBs 104*a*-104*g*. Each eNB 104 may provide communication coverage to a corresponding cell 102. The eNBs 104 may interact with a plurality of UEs, such as, for example, UEs 106*a*-106*l*.

Each UE 106 may communicate with one or more eNBs 104 on a forward link (FL) and/or a reverse link (RL) at a given moment. A FL is a communication link from an eNB to an UE. A RL is a communication link from an UE to an eNB. The FL may also be referred to as the downlink (DL). Further, the RL may also be referred to as the uplink (UL). The eNBs 104 may be interconnected, for example, by appropriate wired or wireless interfaces and may be able to communicate with each other. Each UE 106 may communicate with another UE 106 through one or more eNBs 104.

The wireless communication network 100 may provide service over a large geographic region. For example, the cells 102*a*-102*g* may cover only a few blocks within a neighborhood or several square miles in a rural environment. In one embodiment, each cell may be further divided into one or more sectors (not shown).

As described above, an eNB 104*a* may provide UE 106*a* access within its coverage area to another communications network, such as, for example the internet or another cellular network.

A UE 106*a* may be a wireless communication device (e.g., a mobile phone, router, personal computer, server, etc.) used by a user to send and receive voice or data over a communications network. As shown, UEs 106*a*, 106*h*, and 106*j* may include routers. UEs 106*b*-106*g*, 106*i*, 106*k*, and 106*l* may include mobile phones. More generally, each of UEs 106*a*-106*l* may include any suitable communication device.

Figure 2:
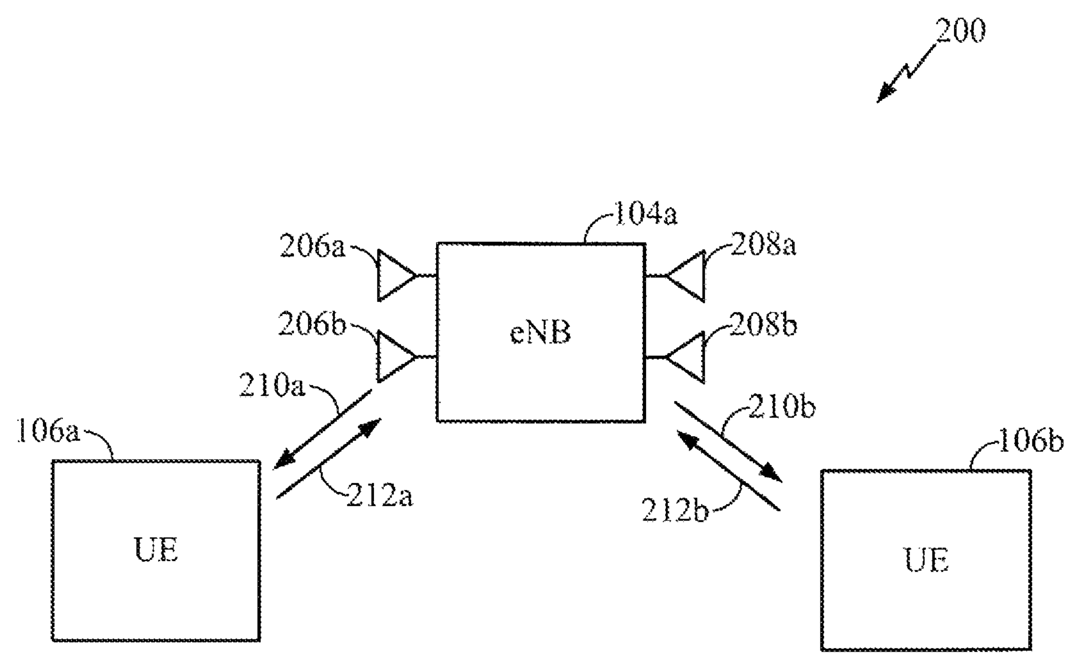
FIG. 2 is a block diagram illustrating a wireless communication system in which the methods disclosed herein may be utilized.

FIG. 2 is a block diagram illustrating a wireless communication system 200 in which the methods disclosed herein may be utilized. The wireless communication system 200 may include one or more eNB 104 that each may include multiple antenna groups. For example, the eNB 104 is illustrated as including two antenna groups, a first group 206 including a first antenna 206*a* and a second antenna 206*b*, and a second group 208 including a third antenna 208*a* and a fourth antenna 208*b*. While the configuration illustrates each antenna group with two antennas, it will be appreciated that more or fewer antennas may be included in each antenna group.

The wireless communication system 200 may also include an UE 106*a* that communicates with the first antenna group 206, where the first antenna 206*a* and second antenna 206*b* transmit information to the UE 106*a* over a first forward link 210*a* and receive information from the UE 106*a* over a first reverse link 212*a*. Likewise, the wireless communication system 200 may also include another UE 106*b* that communicates with the second antenna group 208, where the third antenna 208*a* and the fourth antenna 208*b* transmit information to the UE 106*b* over a second forward link 210*b* and receive information from the UE 106*b* over a second reverse link 212*b*. In the wireless communication system 200, the forward communication links 210 may use different frequencies for communication than the reverse communication links 212.

The system 200 may use Automatic Repeat request (ARQ) or Hybrid ARQ (HARQ) for error control of data transmissions. The eNB 104 and the UEs 106 may exchange accordingly a series of acknowledgment signals (ACK) or non-acknowledgment signals (NACK) based on received data.

The uplink 212 data channel may be referred to as the Primary Uplink Shared Channel (PUSCH), and the corresponding ACK on the downlink 210 may be referred to as the Primary HARQ Indicator Channel, (PHICH). Additionally, the data on the downlink 210 may be referred to as the Primary Downlink Shared Channel (PDSCH) and the corresponding ACK on the uplink 212 may be sent either on the PUSCH or the Primary Uplink Control Channel (PUCCH).

As used herein, the term "user equipment" will generally refer to an electronic device that may be used for voice and/or data communication over a wireless communication system. Examples of user equipments 106 include cellular phones, personal digital assistants (PDAs), handheld devices, wireless modems, laptop computers, personal computers, etc. A user equipment 106 may alternatively be referred to as a subscriber station, a mobile terminal, a mobile station, a remote station, a user terminal, a terminal, a subscriber unit, a mobile device, a wireless device, an access terminal (AT), or some other similar terminology. The term "eNB" as used herein generally refers to a wireless communication station that is installed at a fixed location and used to communicate with UEs 106. An eNB 104 may alternatively be referred to as a base station, a Node B, an evolved Node B, eNodeB, an access point (AP), or some other similar terminology. The term "transmitter" may refer to any electronic device capable of transmitting data, and may refer to either an eNB 104 or an UE 106.

Each group of antennas 206, 208 and/or the area in which they are designed to communicate is often referred to as a sector of the eNB 104. In the illustrated configuration, the antenna groups 206, 208 may be designed to communicate to all UEs 106 in a sector. In other words, each antenna group 206, 208 may be responsible for communicating with all of the UEs 106 in a geographic area.

When communicating over the forward links 210, the transmitting antennas may utilize beamforming in order to improve the signal-to-noise ratio in the UEs 106. Additionally, the eNB 104 may use beamforming when communicating with UEs 106 scattered randomly throughout its coverage in order to minimize interference.

It should be noted that the wireless communication system 200 may include more than one eNB 104 and more or fewer than two UEs 106. Additionally, the eNB 104 may communicate using any suitable channel access method, for example, Frequency Division Multiple Access (FDMA), Code Division Multiple Access (CDMA), Orthogonal Frequency Division Multiple Access (OFDMA), etc.

The system 200 may be a Long Term Evolution (LTE) system according to the 3$^{rd}$ Generation Partnership Project (3GPP). Therefore, the system 200 may use asynchronous Hybrid ARQ (HARQ) on the downlinks 210. Each retransmission may be assigned. This may lessen the need for having ACK-to-NACK detection since the UEs 106 may be aware of whether a new packet has started or not. In the system 200 uplink 212, however, synchronous HARQ may be used. Therefore, the present systems and methods may be beneficial at the eNB 104. Therefore, although described in conjunction with the UEs 106, the present systems and methods may be used advantageously in the eNB 104.

Figure 3A:
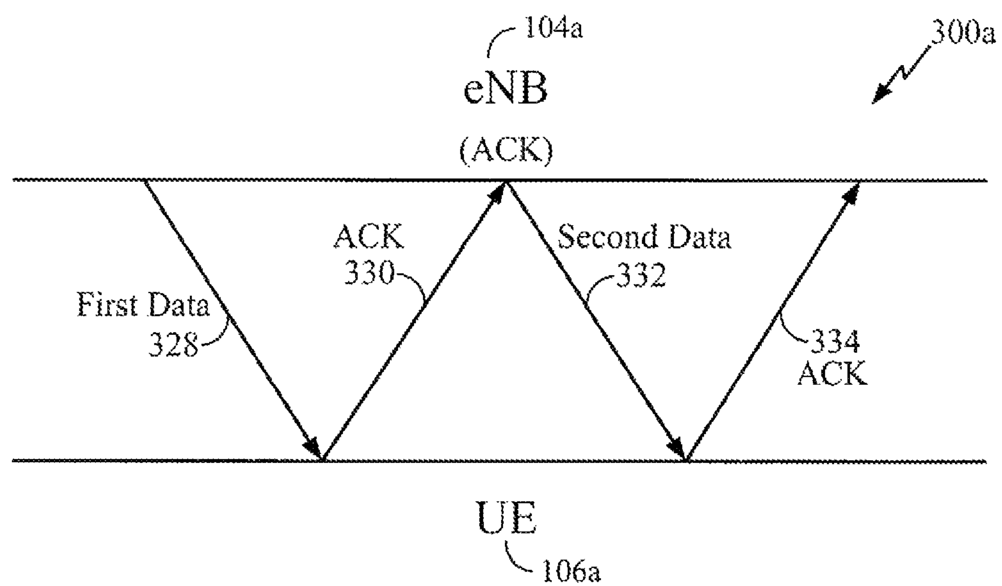
FIG. 3A is a sequence diagram illustrating a system for sending and receiving acknowledgment messages.

FIG. 3A is a sequence diagram 300*a* illustrating a system for sending and receiving acknowledgment messages. The system may include one or more eNBs 104*a* and one or more UEs 106*a* and may use Automatic Repeat request (ARQ) or Hybrid ARQ (HARQ) for error control of data transmissions. The eNB 104*a* may send first data 328, a first packet, for example, to the UE 106*a*. If successfully received, the UE 106*a* may respond by sending an acknowledgment message (ACK) 330 to the eNB 104*a*. The ACK 330 may be a message sent by the UE 106*a* to the eNB 104*a* indicating that the UE 106*a* successfully received the first data 328. If the ACK 330 is interpreted correctly by the eNB 104*a*, the eNB 104*a* may then send second data 332 to the UE 106*a*, for example, a second packet. If the UE 106*a* successfully receives the second data 332, the UE 106*a* may send another ACK 334 to the eNB 104*a*. This process may be repeated for every successful data transmission from the eNB 104*a* to the UE 106*a*, e.g., packet transmission.

Figure 3B:
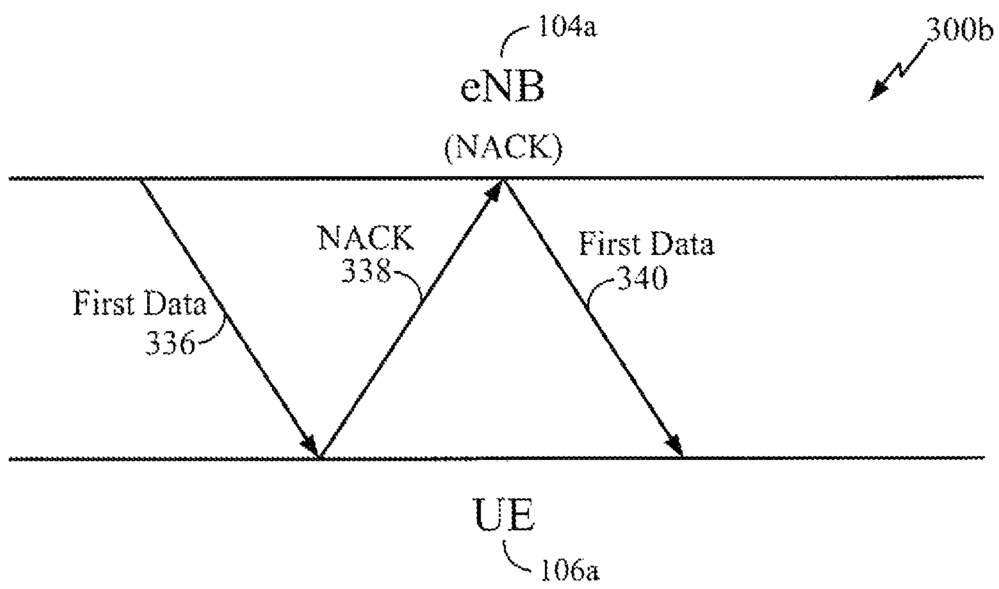
FIG. 3B is another sequence diagram illustrating a system for sending and receiving acknowledgment messages.

FIG. 3B is another sequence diagram 300*b* illustrating a system for sending and receiving acknowledgment messages. The system may also use ARQ or HARQ for error control of data transmissions. As before, the eNB 104*a* may send first data 336, such as a first packet, to the UE 106*a*. Here, however, the UE 106*a* may not successfully receive the first data 336. For example, the UE 106*a* attempts to decode the first data 336 sent from the eNB 104*a*. If the UE 106*a* cannot successfully decode the first data 336 the first data 336 has not been successfully received. In such a case, the UE 106*a* may respond by sending a non-acknowledgment message (NACK) 338 to the eNB 104*a*. The NACK 338 may be a message sent by the UE 106*a* to the eNB 104*a* that indicates that the UE 106*a* did not successfully receive the first data 336. Upon receiving the NACK 338, the eNB 104*a* may then resend the first data 340 to the UE 106*a*. Alternatively, if the system uses HARQ, the eNB 104*a* may send the next increment of the same data packet included in the first data 236. The first data 340 may be resent a predetermined number of times or until an ACK 330 is received in response to the first data 336 being sent.

Figure 4:
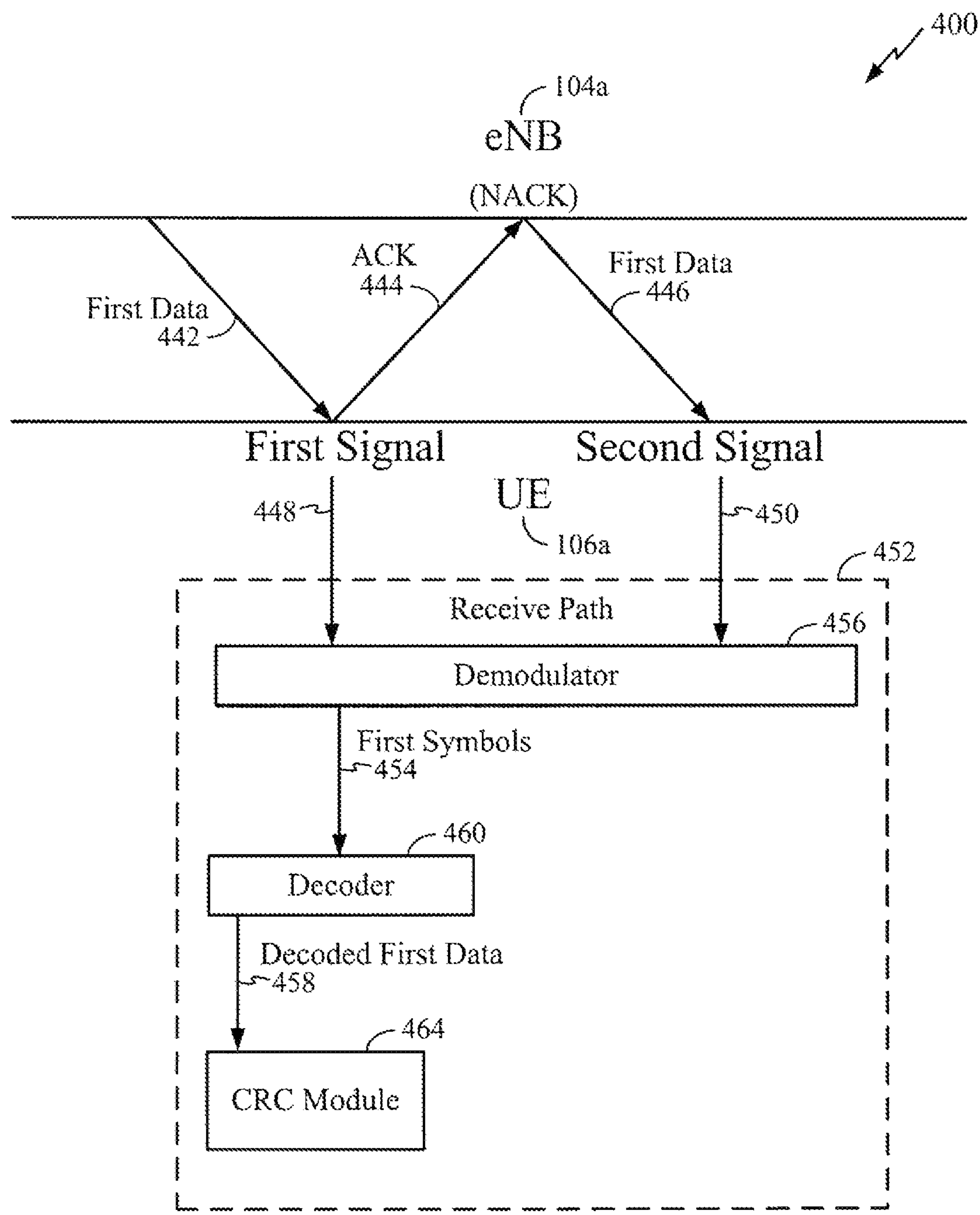
FIG. 4 is a block diagram illustrating a system for sending an acknowledgment message in a wireless communication system.

FIG. 4 is a block diagram illustrating a system 400 for sending an acknowledgment message in a wireless communication system. In FIG. 4, the UE 106*a* is illustrated as receiving signals from the eNB 104*a* and sending signals comprising ACKs or NACKs back to the eNB 104*a*. However, the present systems and methods are equally applicable when the eNB 104*a* receives signals from the UE 106*a* and sends ACKs or NACKs back to the UE 106*a*.

The block diagram at the bottom of FIG. 4 illustrates example processing performed by the UE 106*a* on received data. The UE 106*a* may receive the first data 442 as a first signal 448. The first signal 448 may be processed by a receive path 452 that including, for example, a demodulator 456, a decoder 460 and a cyclic redundancy check (CRC) module 464. The first signal 448 may be demodulated into first symbols 454 by the demodulator 456. The demodulator 456 may use any suitable technique, which may correspond to the technique used to modulate the first signal 448, e.g., Quadrature Amplitude Modulation (QAM), Quadrature Phase-Shift Keying (QPSK), etc. The first symbols 454 may be decoded into decoded first data 458 by the decoder 460. The decoder 460 may use any suitable technique, which may correspond to the technique used to encode the first signal 448, e.g., Turbo code, Viterbi code, etc. The decoded first data 458 may be checked by the CRC module 464 to determine if any errors are present in the received first signal 448. If there are no errors, the UE 106*a* may send a signal 444 comprising an ACK to the eNB 104*a*. If there are errors, the UE 106*a* may send a signal 444 comprising a NACK to the eNB 104*a*. The processing performed in the receive path 452 may be common for received signals from the eNB 104*a*. That is, all received packets may be demodulated at demodulator 456, decoded at decoder 460, and checked by the CRC module 464 if they are to be used by the UE 106*a*.

Although performing a CRC check is referred to herein, other means of checking data to determine if it has changed or has been altered may be used. The term data check may be a more general term used herein to mean a CRC check or any other method for checking data/signal integrity. Other means that may be used to check the data/signal integrity include, but are not limited to, using a parity code or other block codes.

In LTE, a downlink data transmission (e.g., a HARQ packet transmission, transport block, etc.) from an eNB 104 to an UE 106 is made periodically (e.g., every 1 ms). As discussed above, the UE 106 may send a signal 444 comprising an acknowledgement message (ACK) or negative acknowledgment message (NACK), (e.g., within 4 ms), indicating the UE 106 received the transmission successfully or not, respectively. When a NACK message is sent, the eNB 104 retransmits the transmission.

When decoding the data transmission, the UE 106*a* computes a set of log-likelihood ratio (LLR) for each transmission. A likelihood ratio (LR) is the ratio of the maximum probability of a result occurring under two different hypotheses. It is used as a statistical test to choose between the two different hypotheses on which the ratio is based. In an example, a LR is computed by a soft-decision receiver in the UE 106*a* as the ratio of the a posteriori probability for a bit of one output state, for example, '1', to the a posterior probability for a bit of another output state, for example, '0'. A log likelihood ratio (LLR) is defined as the logarithm of the LR and is utilized for computational convenience. For example, by using the LLR, multiplication and division operations applied to a LR become addition and subtraction operations as applied to a LLR.

For data transmissions that are successfully received and decoded, the resulting hard decision or decoded data may be stored by the UE 106*a*. For data transmissions that are not successfully received, for example, transmissions the UE 106*a* is unable to decode due to failure of the CRC check, the UE 106*a* may store a portion of the set of LLRs of the data transmission so that it can combine it with the set of LLRs of the retransmission, increasing the probability the transmission can be successfully decoded. Accordingly, during the time (in this example, 8 ms) between the transmission and the retransmission, a number of other transmissions (in this example, 7) occur, each being referred to as a hybrid automatic repeat request (HARQ) process. Each data transmission may further be divided into a plurality of codeblocks, each having its own a cyclic redundancy check (CRC), and each codeblock having a set of LLRs associated with the codeblock. The sets of LLRs of each codeblock of a data transmission may make up the set of LLRs of the data transmission.

In this example, as a worst case scenario, up to 8 different HARQ processes may occur at any time, and therefore the UE 106*a* may need to store 8 different sets of LLRs. However, some UEs may not have memory with sufficient capacity to store all 8 sets of the LLRs. Accordingly, systems and methods are described below for intelligently reducing the number of LLRs stored in the memory of the UE 106*a*.

Figure 5:
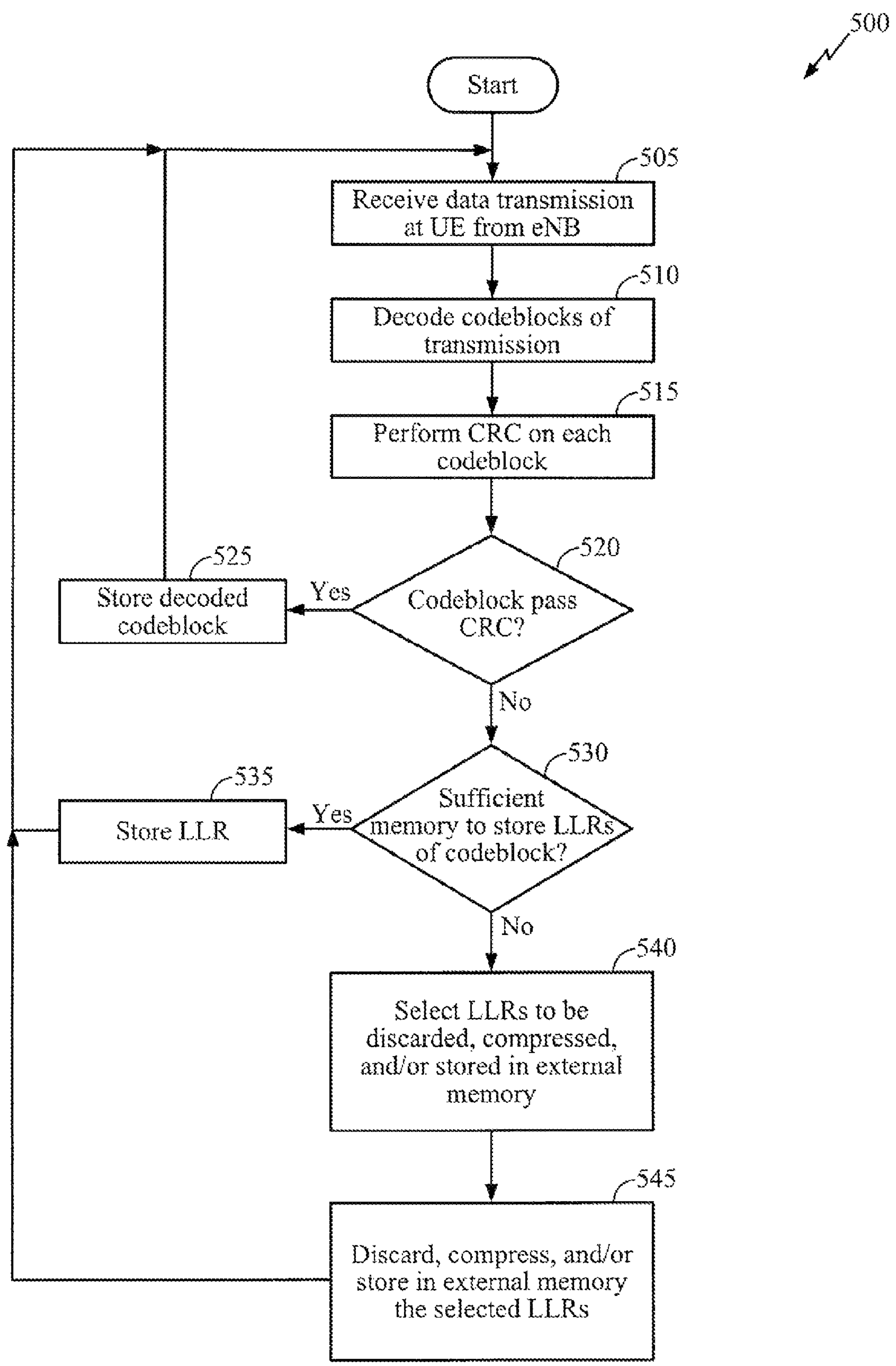
FIG. 5 is a flowchart illustrating a process of selecting transmission data for storage at a UE.

FIG. 5 is a flowchart illustrating a process of selecting transmission data for storage at the UE 106*a* of FIG. 2. At 505, a UE 106*a* receives a data transmission from a eNB 104*a*. At 510, the UE 106*a* attempts to decode each of the codeblocks of the data transmission. At 515, the UE 106*a* performs a cyclic redundancy check on each of the codeblocks of the decoded data transmission. At 520, the UE 106*a* determines whether each of the codeblocks passed the cyclic redundancy check. For a given codeblock, if the UE 106*a* determines the codeblock passed the cyclic redundancy check, the process 500 continues to 525 where UE 106*a* stores the decoded codeblock. The process 500 then returns to receive a data transmission, at 505. At 520, if the UE 106*a* determines a codeblock did not pass the cyclic redundancy check, the process 500 continues to 530.

At 530, the UE 106*a* determines whether there is sufficient memory capacity to store a set of LLRs of the codeblock. If at 530, the UE 106*a* determines there is sufficient memory capacity to store the LLRs of the codeblock, the UE 106*a* stores the LLRs, at 535. The process 500 then returns to receive a data transmission, at 505. If the UE 106*a* determines, at 530, that there is insufficient memory capacity to store the LLRs of the codeblock, the UE 106*a* selects, at 540, a portion of the LLRs from among LLRs stored in memory and the LLRs of the current data transmission to be discarded, compressed, and/or stored in external memory. At 545, the selected LLRs are discarded, compressed, and/or stored in external memory and the remaining LLRs are stored at the UE 106*a*. The process 500 then returns to receive a data transmission, at 505.

In an embodiment, discarding the LLRs includes not storing the particular LLRs in memory. In another embodiment, compression of the LLRs may be performed by deleting a pattern of LLRs belonging to the data transmission. For example, one or more LLRs of a codeblock that fail(s) the CRC may be deleted, while the remaining LLRs of the codeblock are stored in memory. In another embodiment, compression of the LLRs may be performed by reducing the number of bits stored to represent an LLR (e.g., reducing the number of bits used from 6 bits to 3 bits). In another embodiment, a combination of compression techniques may be used.

In an embodiment, storing the LLRs in external memory refers to powering up an external memory, such as a memory attached to the modem of the UE 106*a*, and storing the LLRs in such memory. This may increase power consumption and make increase latency if the memory is used for the external memory is slower than internal memory normally used for storing LLRs. However, such memory may be advantageously cheaper than the internal memory.

In an embodiment, the UE 106*a* may select, at 540, the LLRs of the codeblocks with the lowest overall quality to be discarded, compressed, and/or stored in external memory. In one example, the metric of quality is a measure of how much the LLRs of the codeblock contributes to the likelihood of the successful decode of the retransmitted HARQ process.

One example of the metric of quality is to determine how many or what percentage of codeblocks of the data transmission failed the CRC. In an embodiment, a greater number of failing codeblocks (the lower the percentage that pass the CRC), results in a lowered quality metric assigned to each of the codeblocks that failed the CRC of that data transmission. For example, if a low percentage of codeblocks within the data transmission passes the CRC and the transmission is a first transmission of the data transmission from the eNB 104*a* to the UE 106*a* (i.e., not a retransmission), it is possible that a subframe in which the data transmission was transmitted experienced a deep fade (i.e., the UE 106*a* received the data transmission with a lower signal-to-noise ratio (SNR) than expected). Accordingly, the UE 106*a* may send feedback to the eNB 104*a* about the link or channel quality between the UE 106*a* and the eNB 104*a*. The feedback may include a channel quality index (CQI), where a lower SNR corresponds to a lower CQI. Based on the CQI, the eNB 104*a* may retransmit the data transmission at a lower code rate or with higher transmit power to compensate for the deep fade. Accordingly, the LLRs associated with codeblocks of the retransmission may be more reliable than the LLRs of the original transmission. Therefore, the codeblocks of the original transmission failing the CRC may be given a lower quality metric, as the LLRs from such codeblocks are less likely to be needed to combine with the LLRs from codeblocks of the retransmission which are likely to be of a higher reliability. Therefore, assignment of the lower quality metric to the failing codeblocks as the number of failing codeblocks increases for a data transmission is dependent on the functioning of the eNB 104*a* as described above.

In another embodiment, the greater the number of failing codeblocks of a data transmission, the higher the quality metric assigned to each of the codeblocks that failed the CRC of that data transmission. Assuming that an eNB 104*a* retransmits a data transmission that originally had few failing codeblocks at least at the same code rate and power level as originally transmitted, the probability that the same codeblocks fail in the retransmission is low. Accordingly, there is a high probability that the codeblocks that failed in the original transmission will pass the CRC in the retransmission. Therefore, when few codeblocks fail in an original data transmission, the LLRs of the data transmission are unlikely to be needed for combining with the LLRs of the retransmitted data transmission. Therefore, assignment of the lower quality metric to the codeblocks that fail as the number of failing codeblocks decreases for a data transmission is dependent on the functioning of the eNB 104*a* as described above.

Another example of a quality metric of a codeblock is based on the absolute values of the LLRs of a codeblock. For example, the quality metric of a codeblock may be a function of the absolute value of each of the LLRs of the codeblock. The function may be a sum, mean, median, mode, or some other mathematical function of the absolute value of each of the LLRs of the codeblock. In an example, as the value of function decreases, so does the quality of the LLR.

In yet another example, the UE 106*a* measures the quality of a codeblock by the number of times the associated data transmission has codeblocks that have failed the CRC. For example, if a data transmission has been retransmitted 3 times because codeblocks have failed the CRC check 3 times, it would have a different quality than a different data transmission that has been retransmitted 2 times because codeblocks have failed the CRC only 2 times. In an embodiment, the codeblocks failing a CRC of a data transmission retransmitted a greater number of times are assigned a lower quality metric. For example, there may be something inherently wrong with the data transmission or the channel conditions of the channel on which the data transmission is sent such that additional retransmissions continually have failing codeblocks which cannot be decoded even when LLRs from the various transmissions are combined. Thus, storing the LLRs of the codeblocks may not be advantageous. In another embodiment, the codeblocks failing a CRC of a data transmission retransmitted a greater number of times are assigned a higher quality metric. For example, an eNB 104*a* may select a code rate or transmit power level requiring several retransmissions for the data transmission to be properly decoded. Thus, storing the LLRs of the codeblocks may be advantageous.

Additional metrics for selecting a quality metric for codeblocks of a data transmission may also be used. In an embodiment, the modulation and coding scheme level (a measure of code rate) of a data transmission can be used to set the quality metric codeblocks of the data transmission failing a CRC. In an embodiment including a multiple-input and multiple-output (MIMO) communication network, where multiple streams of data (e.g., multiple data transmissions) may be sent in parallel between the UE 106*a* and the eNB 104*a*, a rank of the data transmission may be used to set the quality metric of codeblocks of the data transmission that fail the CRC. The rank is the number of MIMO layers, or simultaneous parallel transmissions, occurring between the UE 106*a* and the eNB 104*a* at the time of communication of the data transmission.

Further, any number of the above examples techniques for measuring the quality codeblocks may be used in combination. In such an embodiment, the techniques may be weighted evenly or unevenly in making a determination of quality.

In another embodiment, LLRs may be selected in the order they are received, such as according to a first-in-first-out or last-in-first-out system.

Figure 6:
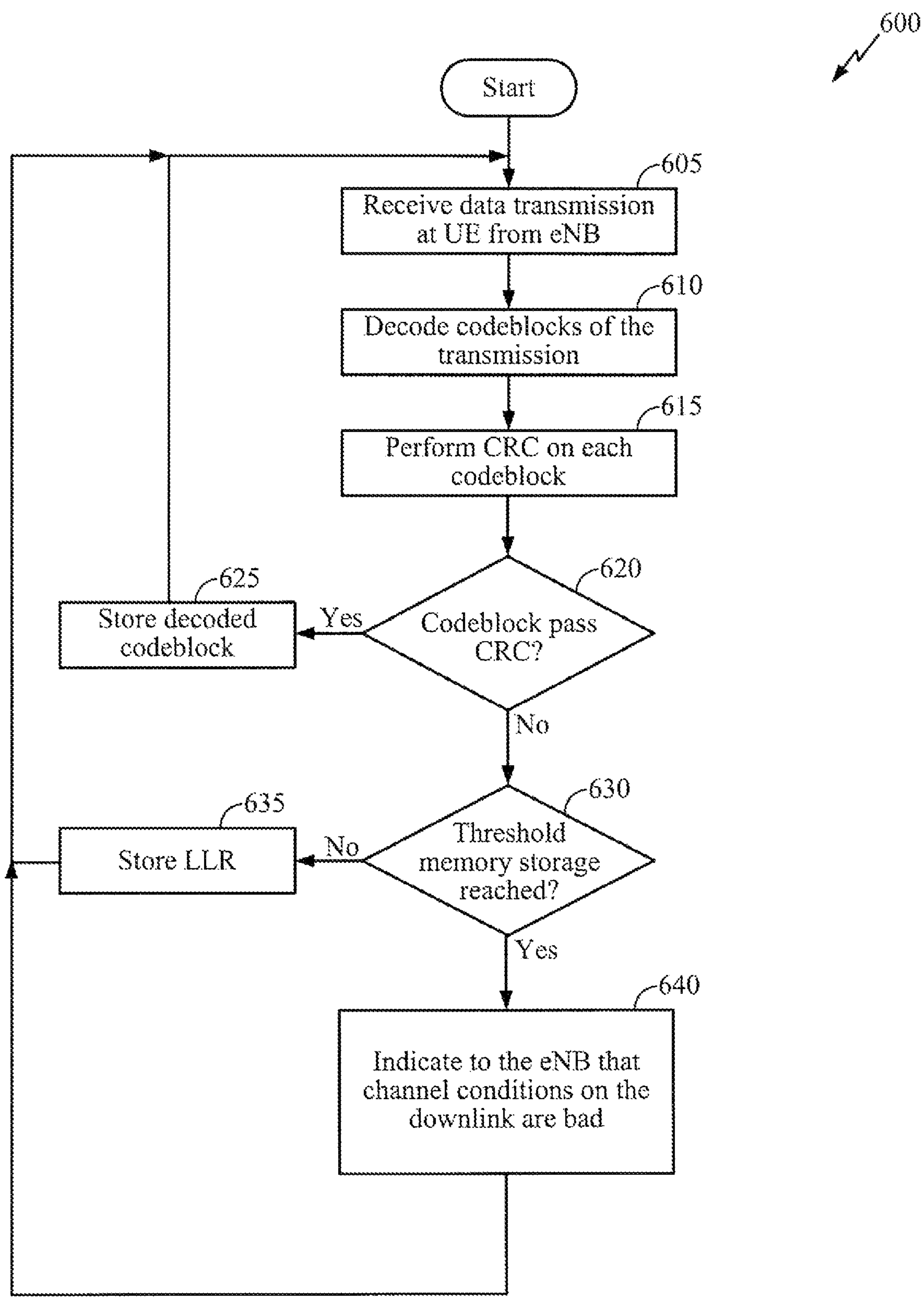
FIG. 6 is a flowchart illustrating a process of reducing data transmission errors at a UE.

FIG. 6 is a flowchart illustrating a process of reducing the number of data transmission errors at a UE 106*a*. At 605, a UE 106*a* receives a data transmission from a eNB 104*a*. At 610, the UE 106*a* attempts to decode each of the codeblocks of the data transmission. At 615, the UE 106*a* performs a CRC on each of the codeblocks of the decoded data transmission. At 620, the UE 106*a* determines whether each of the codeblocks passed the cyclic redundancy check. For a given codeblock, the UE 106*a* determines whether the codeblock passed the cyclic redundancy check. If so, the UE 106*a* stores the decoded codeblock, at 625, and a data transmission is received, at 605.

If the UE 106*a* determines, at 620, that the codeblock did not pass the CRC, the UE 106*a* determines, at 630, whether storing the LLRs of the codeblock would put the available capacity of the memory of the UE 106*a* below a threshold level for storing LLRs. For example, the threshold level may be 20% of the overall capacity of the memory allocated for storing LLRs. If the UE 106*a* determines, at 630, that storing the LLR would not cause the available capacity to fall below the threshold level of memory usage, the LLRs are stored in memory, at 635, following which a data transmission is received, at 605. If the UE 106*a* determines, at 630, that storing the LLRs would cause the available capacity to fall below the threshold level of memory usage, the UE 106*a* indicates to the eNB 104*a*, at 640, that channel conditions on the downlink are unfavorable via a quality indicator, even if they are not unfavorable. This will cause the eNB 104*a* to transmit data transmissions at a higher energy level and/or code data transmissions at a lower rate, thus increasing the chance that the data transmission is received successfully so that the LLRs need not be stored for that data transmission. A data transmission may then be received, at 605. In at embodiment, the quality indicator comprises a CQI. In another embodiment where the UE 106*a* and eNB 104*a* communicate using MIMO systems, the quality indicator may include a rank index (RI). The rank index causes the eNB 104*a* to adjust the number of parallel data streams used for transmitting data transmissions to the UE 106*a*.

One of ordinary skill in the art will appreciate that processes 500 and 600 are merely illustrative. Portions of the processes 500 and 600 may be removed, additional steps may be added, and/or the order of steps changed, while still being consistent with the principles and novel features disclosed herein. Further, the processes 500 and 600 may be used in conjunction with one another. For example, the portions described at 630 to 640 may be performed as part of process 500 before immediately before step 530.

Figure 7:
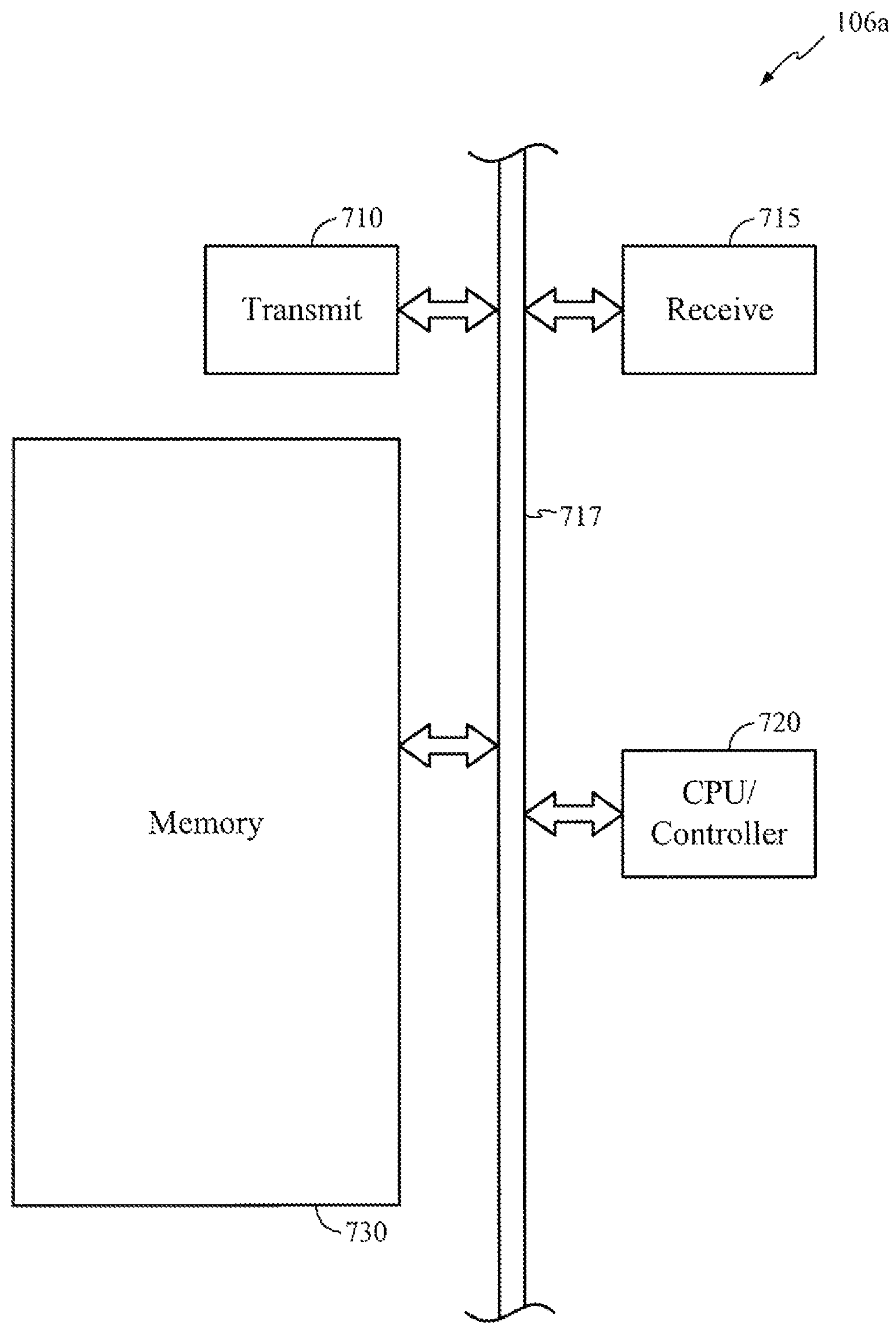
FIG. 7 is a functional block diagram of an example UE.

FIG. 7 is a functional block diagram of an example user equipment 106*a*. The UE 106*a* may communicate with an eNB 104*a* to send and receive data to and from the eNB 104*a*. The UE 106*a* may comprise a transmit module 710 configured to transmit an outbound message to the eNB 104*a*. The UE 106*a* may further comprise a receive module 715 configured to receive an incoming message, such as a data transmission from the eNB 104*a*. The transmit module 710 and the receive module 715 may be coupled to a central processing unit (CPU)/controller 720 via a bus 717. The CPU 720 may be configured to process the inbound and outbound messages coming from or going to the eNB 104*a*. The CPU 720 may also be configured to control other components of the UE 106*a*.

As shown in FIG. 7, the CPU 720 may further be coupled to a memory 730 via the bus 717. The CPU 720 may read information from or write information to the memory 730. For example, the memory 730 may be configured to store inbound or outbound messages before, during, or after processing and/or records of connections and connection contexts. The memory 730 may also store instructions or functions for execution on the CPU 720, such as, for example, instructions or functions for performing processes and methods described herein.

The transmit module 710 may comprise a modulator configured to modulate outbound message going to the eNB 104*a*. The receive module 715 may comprise a demodulator configured to demodulate inbound messages coming from the eNB 104*a*.

The memory 730 may comprise processor cache, including a multi-level hierarchical cache in which different levels have different capacities and access speeds. The memory 730 may also comprise random access memory (RAM), other volatile storage devices, or non-volatile storage devices. Such storage devices may include hard drives, optical discs, such as compact discs (CDs) or digital video discs (DVDs), flash memory, floppy discs, magnetic tape, Zip drives, etc.

Although described separately, it will be appreciated that functional blocks described with respect to the UE 106*a* need not be separate structural elements. For example, the CPU 720 and the memory 730 may be embodied on a single chip. The CPU 720 may additionally, or in the alternative, contain memory, such as processor registers. Similarly, one or more of the functional blocks or portions of the functionality of various blocks may be embodied on a single chip. Alternatively, the functionality of a particular block may be implemented on two or more chips.

One or more of the functional blocks and/or one or more combinations of the functional blocks described with respect to the UE 106*a* may be embodied as a general purpose processor, a digital signal processor (DSP), an application specific integrated device (ASIC), discrete gate or transistor logic, discrete hardware components, circuitry or any suitable combination thereof designed to perform the functions described herein. In this specification and the appended claims, it should be clear that the term "circuitry" should be construed as a structural term and not as a functional term. For example, circuitry can be an aggregate of circuit components, such as a multiplicity of integrated circuit components, in the form of processing and/or memory cells, units, blocks, modules, and the like, such as are described in relation to FIG. 7. One or more of the functional blocks and/or one or more combinations of the functional blocks described with respect to the UE 106*a* may also be implemented as a combination of computing devices, e.g., a combination of a DSP and a microprocessor, a plurality of microprocessors, one or more microprocessor in conjunction with a DSP communication, or any other such configuration.

Figure 8:
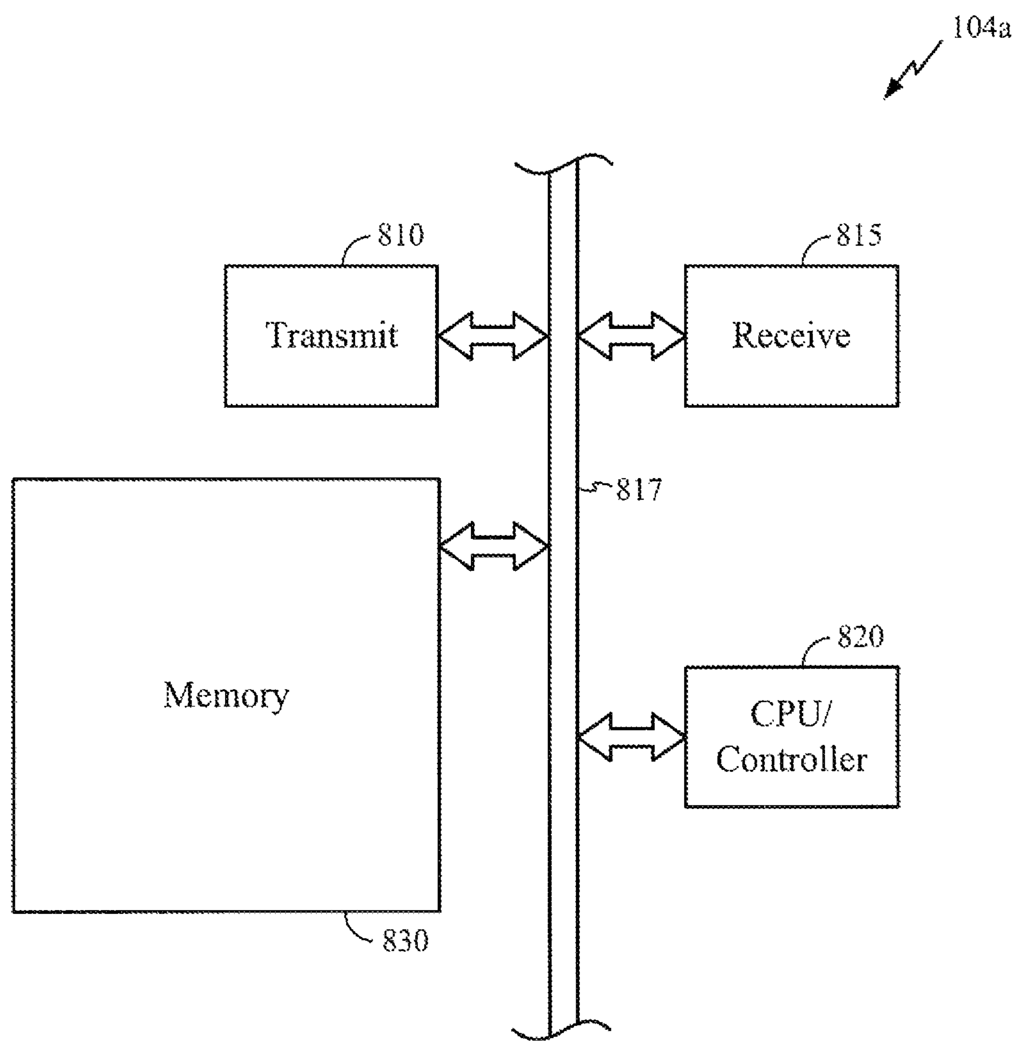
FIG. 8 is a functional block diagram of an example eNB.

FIG. 8 is a functional block diagram of an example eNB 104*a*. As discussed above in relation to FIG. 2, the eNB 104*a* may send/receive data to/from the UE 106*a*. Further, the eNB 104*a* may communicate with a communications network comprising one or more network components. Accordingly, the eNB 104*a* may facilitate communication between the UE 106*a* and the communications network. The eNB 104*a* may comprise a transmit module 810 configured to transmit an outbound message, such as a data transmission. The eNB 104*a* may further comprise a receive module 815 configured to receive an incoming message. The transmit module 810 and the receive module 815 may be coupled to a central processing unit (CPU)/controller 820 via a bus 817. The CPU 820 may be configured to process the inbound and outbound messages. The CPU 820 may also be configured to control other components of the eNB 104*a*.

As shown in FIG. 8, the CPU 820 may be coupled to a memory 830 via a bus 817. The CPU 820 may read information from or write information to the memory 830. The memory 830 may be configured to store inbound or outbound messages before, during, or after processing and/or records of connections and connection contexts. The memory 830 may also be used to store instructions or functions for execution on the CPU 100, such as, for example, instructions or functions for performing processes and methods described herein.

The transmit module 810 may comprise a modulator configured to modulate outbound messages going to the UE 106*a*. The receive module 815 may comprise a demodulator configured to demodulate inbound messages coming from the UE 106*a*.

The memory 830 may comprise processor cache, including a multi-level hierarchical cache in which different levels have different capacities and access speeds. The memory 830 may also comprise random access memory (RAM), other volatile storage devices, or non-volatile storage devices. The storage may include hard drives, optical discs, such as compact discs (CDs) or digital video discs (DVDs), flash memory, floppy discs, magnetic tape, Zip drives, etc.

Although described separately, it will be appreciated that functional blocks described with respect to the eNB 104*a* need not be separate structural elements. For example, the CPU 820 and the memory 830 may be embodied on a single chip. The CPU 820 may additionally, or in the alternative, contain memory, such as processor registers. Similarly, one or more of the functional blocks or portions of the functionality of various blocks may be embodies on a single chip. Alternatively, the functionality of a particular block may be implemented on two or more chips.

One or more of the functional blocks and/or one or more combinations of the functional blocks described with respect to the eNB 104*a* may be embodied as a general purpose processor, a digital signal processor (DSP), an application specific integrated device, discrete gate or transistor logic, discrete hardware components, circuitry or any suitable combination thereof designed to perform the functions described herein. It should be noted that the term "circuitry" should be construed as a structural term and not as a functional term. For example, circuitry can be an aggregate of circuit components, such as a multiplicity of integrated circuit components, in the form of processing and/or memory cells, units, blocks, modules, and the like, such as shown and described in FIG. 8. One or more of the functional blocks and/or one or more combinations of the functional blocks described with respect to the UE 106*a* may also be implemented as a combination of computing devices, e.g., a combination of a DSP and a microprocessor, a plurality of microprocessors, one or more microprocessor in conjunction with a DSP communication, or any other such configuration.

The functionality described herein (e.g., with regard to one or more of the accompanying figures) may correspond in some aspects to similarly designated "means for" functionality in the appended claims. Referring to FIGS. 7-10, the UE 106*a* and the eNB 104*a* are represented as a series of interrelated functional modules.

Figure 9:
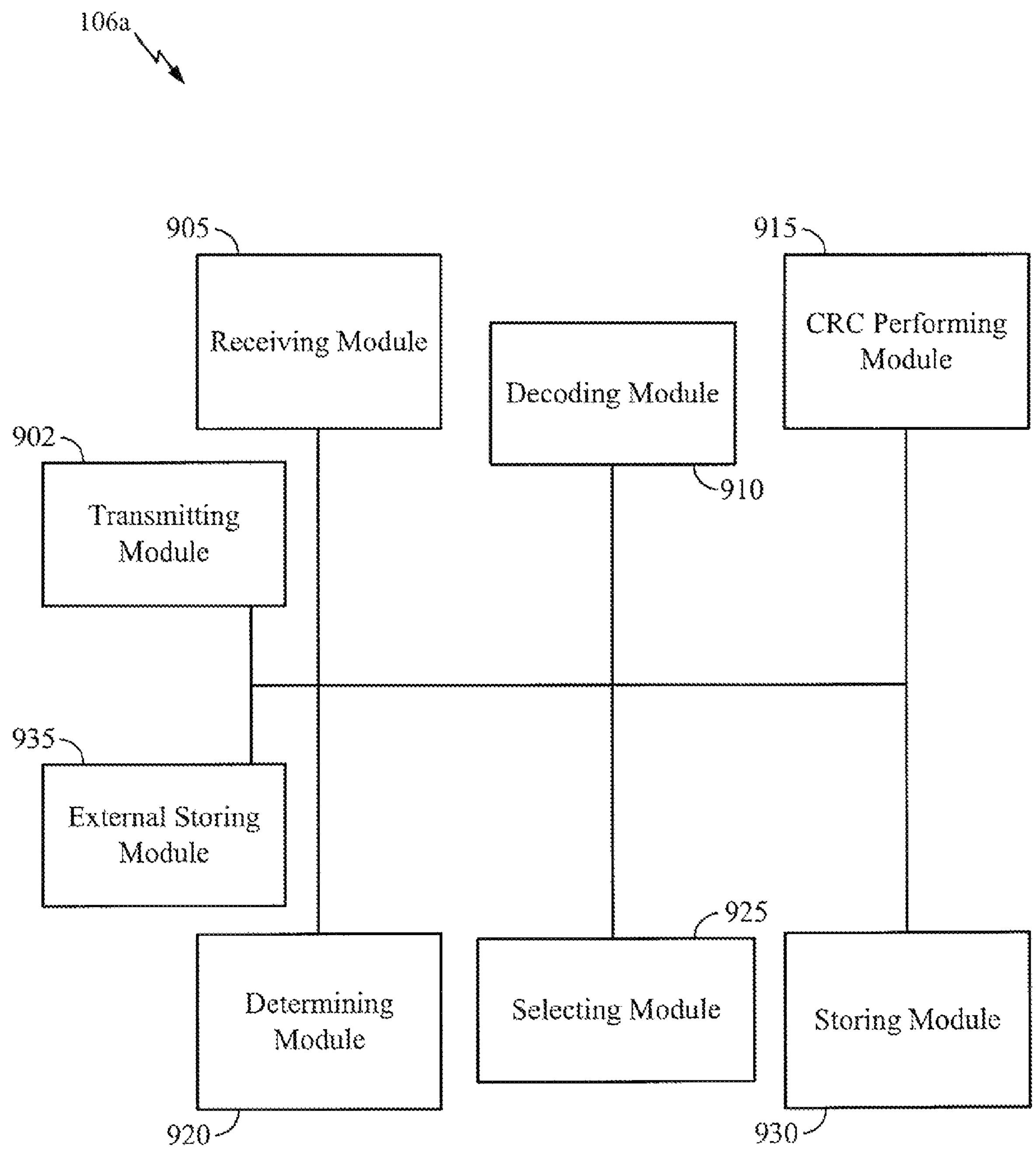
FIG. 9 is a functional block diagram of an example UE in a communication network.

FIG. 9 is a functional block diagram of an example UE such one of those depicted in FIG. 2. As shown, the UE 106*a* may comprise a transmitting module 902, a receiving module 905, a decoding module 910, a CRC performing module 915, a determining module 920, a selecting module 925, storing module 930, and an external storing module 935. The transmitting module 902 may correspond at least in some aspects to, for example, a transmit module as discussed in the foregoing. The receiving module 905 may correspond at least in some aspects to, for example, a receive module as discussed in the foregoing. The decoding module 910 may correspond at least in some aspects to, for example, a CPU and/or a memory as discussed herein. The CRC performing module 915 may correspond at least in some aspects to, for example, a CPU and/or a memory as discussed herein. The determining module 920 may correspond at least in some aspects to, for example, a CPU and/or a memory as discussed herein. The selecting module 925 may correspond at least in some aspects to, for example, a CPU and/or a memory as discussed herein. The storing module 930 may correspond at least in some aspects to, for example, a memory as discussed herein. The external storing module 935 may correspond at least in some aspects to, for example, an external memory as discussed herein.

Figure 10:
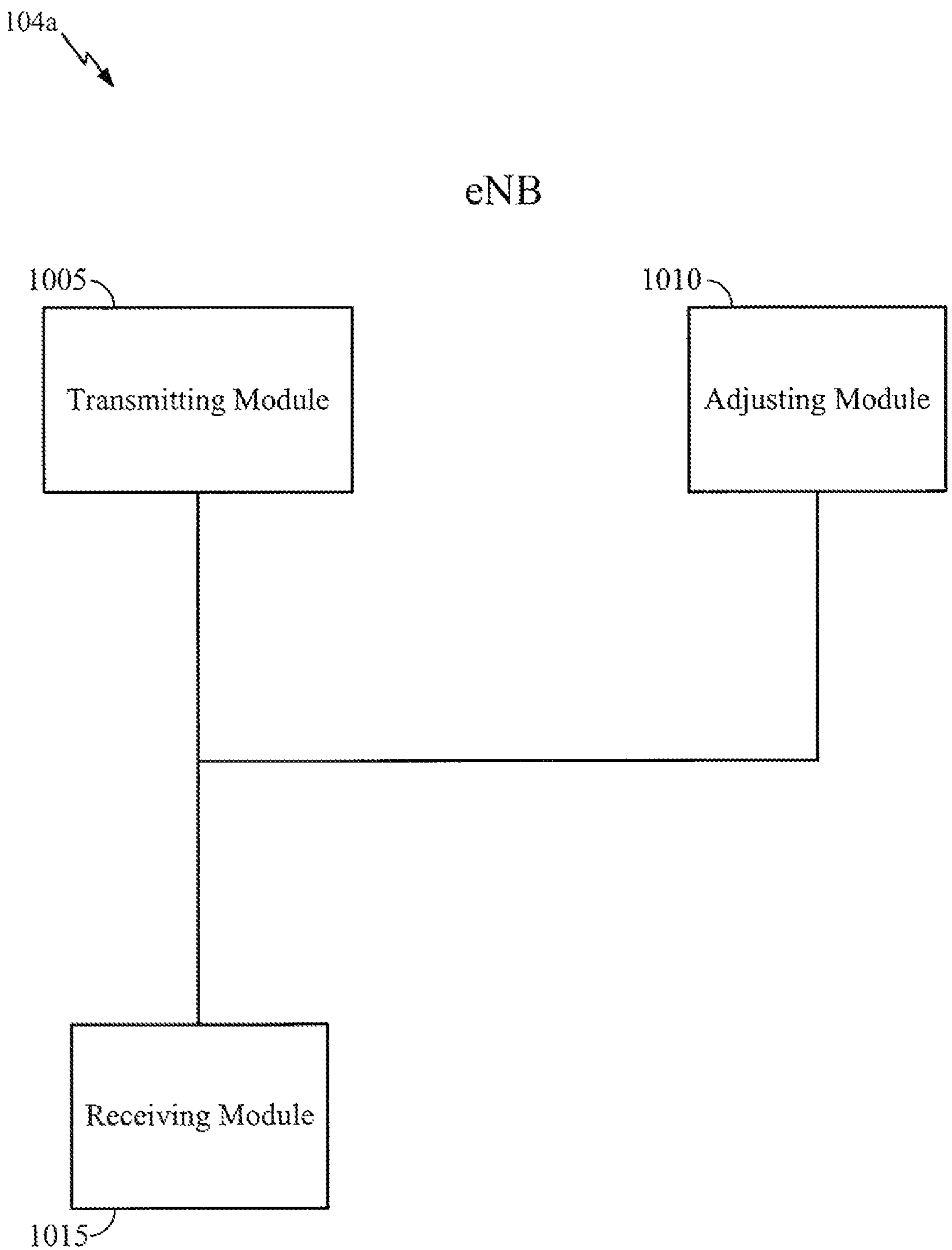
FIG. 10 is a functional block diagram of an example eNB in a communication network.

FIG. 10 is a functional block diagram of another exemplary eNB in one of the communication networks of FIG. 2. As shown, the eNB 104*a* may comprise a transmitting module 1005, an adjusting module 1010, and a receiving module 1015. The transmitting module 1005 may correspond at least in some aspects to, for example, a transmit circuit as discussed herein. The adjusting module 1010 may correspond at least in some aspects to, for example, a CPU and/or a memory as discussed herein. The receiving module 1015 may correspond at least in some aspects to, for example, a CPU and/or a receive circuit as discussed herein.

The functionality of the modules of FIGS. 7-10 may be implemented in various ways consistent with the teachings herein. In some aspects the functionality of these modules may be implemented as one or more electrical components. In some aspects the functionality of these blocks may be implemented as a processing system including one or more processor components. In some aspects the functionality of these modules may be implemented using, for example, at least a portion of one or more integrated circuits (e.g., an ASIC). As discussed herein, an integrated circuit may include a processor, software, other related components, or some combination thereof. The functionality of these modules also may be implemented in some other manner as taught herein.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise, a set of elements may comprise one or more elements. In addition, terminology of the form "at least one of: A, B, or C" used in the description or the claims means "A or B or C or any combination of these elements."

Those skilled in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those skilled in the art will further appreciate that the various illustrative logical blocks, modules, circuits, methods and algorithms described in connection with the examples disclosed herein may be implemented as electronic hardware, computer software, or combinations of both. To clearly illustrate this interchangeability of hardware and software, various illustrative components, blocks, modules, circuits, methods and algorithms have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP communication, or any other such configuration.

The methods or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor may read information from, and write information to, the storage medium. In the alternative, the storage medium may be integral to the processor. The processor and the storage medium may reside in an ASIC.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed examples is provided to enable any person skilled in the art to make or use the present invention. Various modifications to these examples will be readily apparent to those skilled in the art, and the generic principles defined herein may be applied to other examples without departing from the spirit or scope of the invention. Thus, the present invention is not intended to be limited to the examples shown herein but is to be accorded the widest scope consistent with the principles and novel features disclosed herein.

What is claimed is:

1. A method of managing storage in a wireless communication device, the method comprising:

receiving a first data transmission comprising a first plurality of blocks at the wireless communication device;

decoding the first plurality of blocks;

performing a cyclic redundancy check on each of the first plurality of blocks;

determining whether each of the first plurality of blocks passes the cyclic redundancy check;

determining whether a memory has sufficient capacity to store a plurality of log-likelihood ratios associated with a first portion of the first plurality of blocks that fail the cyclic redundancy check;

selecting for storage a first portion of the plurality of log-likelihood ratios based on a quality metric of each of the associated blocks, wherein the selected first portion of log-likelihood ratios are associated with blocks having higher quality metrics than the quality metrics of the blocks associated with a second portion of the plurality of log-likelihood ratios not selected; and storing the second portion of the plurality of log-likelihood ratios not selected in an external memory.

2. The method of claim 1, further comprising storing a second portion of the decoded first plurality of blocks that pass the cyclic redundancy check.

3. The method of claim 1, further comprising:

receiving a second data transmission comprising a second plurality of blocks at the wireless communication device;

decoding the second plurality of blocks;

performing a cyclic redundancy check on each of the second plurality of blocks; and storing the decoded second plurality of blocks if all of the second plurality of blocks pass the cyclic redundancy check.

4. The method of claim 1, wherein the quality metric of a block is a function of the absolute values of each of the plurality of log-likelihood ratios associated with the block, and wherein a higher function value corresponds to a higher quality metric.

5. The method of claim 1, wherein the quality metric of each of the blocks of the first portion of the first plurality of blocks that fail the cyclic redundancy check is a function of the percentage of the first plurality of blocks of the first data transmission that pass the cyclic redundancy check, and wherein a higher percentage corresponds to a higher quality metric.

6. The method of claim 1, wherein the quality metric of each of the blocks of the first portion of the first plurality of blocks that fail the cyclic redundancy check is a function of the percentage of the first plurality of blocks of the first data transmission that pass the cyclic redundancy check, and wherein a higher percentage corresponds to a lower quality metric.

7. The method of claim 1, wherein the quality metric of each of the blocks of the first portion of the first plurality of blocks that fail the cyclic redundancy check is a function of the number of times the first data transmission is received before all of the first plurality of blocks pass the cyclical redundancy check, wherein a higher number of times the data transmission is received corresponds to a lower quality metric.

8. The method of claim 1, wherein the quality metric of each of the blocks of the first portion of the first plurality of blocks that fail the cyclic redundancy check is a function of the number of times the first data transmission is received before all of the first plurality of blocks pass the cyclical redundancy check, wherein a higher number of times the data transmission is received corresponds to a higher quality metric.

9. A method of managing storage in a wireless communication device, the method comprising:

receiving a first data transmission comprising a first plurality of blocks at the wireless communication device;

decoding the first plurality of blocks;

performing a cyclic redundancy check on each of the first plurality of blocks;

determining whether each of the first plurality of blocks passes the cyclic redundancy check;

determining whether a memory has sufficient capacity to store a plurality of log-likelihood ratios associated with a first portion of the first plurality of blocks that fail the cyclic redundancy check;

selecting for storage a first portion of the plurality of log-likelihood ratios based on a quality metric of each of the associated blocks, wherein the selected first portion of log-likelihood ratios are associated with blocks having higher quality metrics than the quality metrics of the blocks associated with a second portion of the plurality of log-likelihood ratios not selected; and compressing the second portion of the plurality of log-likelihood ratios not selected.

10. A method of managing storage in a wireless communication device, the method comprising:

receiving a plurality of data transmissions at the wireless communication device from a communication node;

determining whether each of the plurality of data transmissions passes a cyclic redundancy check;

determining whether storing data associated with one or more of the data transmissions that failed the cyclic redundancy check in a memory would cause an available capacity of the memory to fall below a threshold level; and transmitting a quality indicator to the communication node when the available capacity of the memory falls below the threshold level.

11. The method of claim 10, wherein the quality indicator is configured to cause the communication node to adjust a number of parallel data streams used for transmitting data transmissions to the wireless communication device.

12. The method of claim 10, wherein the quality indicator is configured to cause the communication node to increase a power level used to transmit data transmissions or to code data transmissions at a lower rate.

13. A wireless communication device comprising:

a memory; and a processor coupled to the memory, the processor being configured to:

receive a first data transmission comprising a first plurality of blocks;

decode the first plurality of blocks;

perform a cyclic redundancy check on each of the first plurality of blocks;

determine whether each of the first plurality of blocks passes the cyclic redundancy check;

determine whether the memory has sufficient capacity to store a plurality of log-likelihood ratios associated with a first portion of the first plurality of blocks that fail the cyclic redundancy check;

select for storage a first portion of the plurality of log-likelihood ratios based on a quality metric of each of the associated blocks, wherein the selected first portion of log-likelihood ratios are associated with blocks having higher quality metrics than the quality metrics of the blocks associated with a second portion of the plurality of log-likelihood ratios not selected; and an external memory configured to store the second portion of the plurality of log-likelihood ratios not selected.

14. The device of claim 13, wherein the memory is configured to store a second portion of the decoded first plurality of blocks that pass the cyclic redundancy check.

15. The device of claim 13, wherein the processor is further configured to:

receive a second data transmission comprising a second plurality of blocks;

decode the second plurality of blocks; and perform a cyclic redundancy check on each of the second plurality of blocks, and wherein the memory is configured to store the decoded second plurality of blocks if all of the second plurality of blocks pass the cyclic redundancy check.

16. The device of claim 13, wherein the quality metric of a block is a function of the absolute values of each of the plurality of log-likelihood ratios associated with the block, and wherein a higher function value corresponds to a higher quality metric.

17. The device of claim 13, wherein the quality metric of each of the blocks of the first portion of the first plurality of blocks that fail the cyclic redundancy check is a function of the percentage of the first plurality of blocks of the first data transmission that pass the cyclic redundancy check, and wherein a higher percentage corresponds to a higher quality metric.

18. The device of claim 13, wherein the quality metric of each of the blocks of the first portion of the first plurality of blocks that fail the cyclic redundancy check is a function of the percentage of the first plurality of blocks of the first data transmission that pass the cyclic redundancy check, and wherein a higher percentage corresponds to a lower quality metric.

19. The device of claim 13, wherein the quality metric of each of the blocks of the first portion of the first plurality of blocks that fail the cyclic redundancy check is a function of the number of times the first data transmission is received before all of the first plurality of blocks pass the cyclical redundancy check, wherein a higher number of times the data transmission is received corresponds to a lower quality metric.

20. The device of claim 13, wherein the quality metric of each of the blocks of the first portion of the first plurality of blocks that fail the cyclic redundancy check is a function of the number of times the first data transmission is received before all of the first plurality of blocks pass the cyclical redundancy check, wherein a higher number of times the data transmission is received corresponds to a higher quality metric.

21. A wireless communication device comprising:

a memory; and a processor coupled to the memory, the processor being configured to:

receive a first data transmission comprising a first plurality of blocks;

decode the first plurality of blocks;

perform a cyclic redundancy check on each of the first plurality of blocks;

determine whether each of the first plurality of blocks passes the cyclic redundancy check;

determine whether the memory has sufficient capacity to store a plurality of log-likelihood ratios associated with a first portion of the first plurality of blocks that fail the cyclic redundancy check;

select for storage a first portion of the plurality of log-likelihood ratios based on a quality metric of each of the associated blocks, wherein the selected first portion of log-likelihood ratios are associated with blocks having higher quality metrics than the quality metrics of the blocks associated with a second portion of the plurality of log-likelihood ratios not selected; and compress the second portion of the plurality of log-likelihood ratios not selected.

22. A wireless communication device comprising:

a memory; and a processor coupled to the memory, the processor being configured to:

receive a plurality of data transmissions from a communication node;

determine whether each of the plurality of data transmissions passes a cyclic redundancy check;

determine whether storing data associated with one or more of the data transmissions that failed the cyclic redundancy check in the memory would cause an available capacity of the memory to fall below a threshold level; and transmit a quality indicator to the communication node when the available capacity of the memory falls below the threshold level.

23. The device of claim 22, wherein the quality indicator is configured to cause the communication node to adjust a number of parallel data streams used for transmitting data transmissions to the wireless communication device.

24. The device of claim 22, wherein the quality indicator is configured to cause the communication node to increase a power level used to transmit data transmissions or to code data transmissions at a lower rate.

25. A wireless communication device comprising:

means for receiving a first data transmission comprising a first plurality of blocks;

means for decoding the first plurality of blocks;

means for performing a cyclic redundancy check on each of the first plurality of blocks;

means for determining whether each of the first plurality of blocks passes the cyclic redundancy check;

means for determining whether a memory has sufficient capacity to store a plurality of log-likelihood ratios associated with a first portion of the first plurality of blocks that fail the cyclic redundancy check;

means for selecting for storage a first portion of the plurality of log-likelihood ratios based on a quality metric of each of the associated blocks, wherein the selected first portion of log-likelihood ratios are associated with blocks having higher quality metrics than the quality metrics of the blocks associated with a second portion of the plurality of log-likelihood ratios not selected; and means for storing the second portion of the plurality of log-likelihood ratios not selected in an external memory.

26. A wireless communication device comprising:

means for receiving a plurality of data transmissions from a communication node;

means for determining whether each of the plurality of data transmissions passes a cyclic redundancy check;

means for determining whether storing data associated with one or more of the data transmissions that failed the cyclic redundancy check in a memory would cause an available capacity of the memory to fall below a threshold level; and means for transmitting a quality indicator to the communication node when the available capacity of the memory falls below the threshold level.

27. A computer program product comprising:

a non-transitory computer-readable medium comprising:

code for causing a computer to receive a first data transmission comprising a first plurality of blocks at a wireless communication device;

code for causing a computer to decode the first plurality of blocks;

code for causing a computer to perform a cyclic redundancy check on each of the first plurality of blocks;

code for causing a computer to determine whether each of the first plurality of blocks passes the cyclic redundancy check;

code for causing a computer to determine whether a memory has sufficient capacity to store a plurality of log-likelihood ratios associated with a first portion of the first plurality of blocks that fail the cyclic redundancy check;

code for causing a computer to select for storage a first portion of the plurality of log-likelihood ratios based on a quality metric of each of the associated blocks, wherein the selected first portion of log-likelihood ratios are associated with blocks having higher quality metrics than the quality metrics of the blocks associated with a second portion of the plurality of log-likelihood ratios not selected; and code for causing a computer to store the second portion of the plurality of log-likelihood ratios not selected in an external memory.

28. A computer program product comprising:

a non-transitory computer-readable medium comprising:

code for causing a computer to receive a plurality of data transmissions at a wireless communication device from a communication node;

code for causing a computer to determine whether each of the plurality of data transmissions passes a cyclic redundancy check;

code for causing a computer to determine whether storing data associated with one or more of the data transmissions that failed the cyclic redundancy check in a memory would cause an available capacity of the memory to fall below a threshold level; and code for causing a computer to transmit a quality indicator to the communication node when the available capacity of the memory falls below the threshold level.

* * * * *